United States Patent [19]

Stevens

[11] 3,991,376
[45] Nov. 9, 1976

[54] PULSE HEIGHT ANALYZER

[75] Inventor: William M. Stevens, Loveland, Ohio

[73] Assignee: Randam Electronics, Inc., Cincinnati, Ohio

[22] Filed: Apr. 16, 1975

[21] Appl. No.: 568,438

[52] U.S. Cl. ............................ 328/115; 307/235 N; 328/117
[51] Int. Cl.² ...................... H03K 5/20; H03K 5/18
[58] Field of Search .......... 307/235 N; 328/115–117

[56] References Cited
UNITED STATES PATENTS

| | | | |
|---|---|---|---|
| 3,428,827 | 2/1969 | Berry | 307/235 N |
| 3,683,284 | 8/1972 | Mueller | 307/235 N |
| 3,816,761 | 6/1974 | Ahmed | 307/235 N |

Primary Examiner—John Zazworsky
Attorney, Agent, or Firm—Eugene F. Friedman

[57] ABSTRACT

A pulse height analyzer determining, by about the end of an input pulse, whether the pulse's magnitude falls within a preselected range. Two comparators, which establish the preselected range, couple to a coincidence means, such as a D-type flip-flop. The coincidence means provides one indication when the pulse falls within the selected range and another indication when the pulse exceeds the upper limit. Output means, typically one or more flip-flops, may then operate upon these indications to provide, as usual, one output pulse for each input pulse falling within the range. The circuit obviates the need for R-C delaying components and results in greater resolution between close pulses, quicker response times, and less sensitivity to the particular value of the components used. The timing for the output means may derive either from an external clock or from the effect of the input pulse itself upon the comparators.

31 Claims, 6 Drawing Figures

3,991,376

PULSE HEIGHT ANALYZER

BACKGROUND

Pulse height analyzers frequently function by counting the pulses falling within a particular energy or voltage range, called a "window." Two comparators generally set the upper and lower limits of the range, with the subsequent cicuitry providing a single pulsed output for each input pulse in the range.

One area in which such pulse height analyzers have found appreciable use involves the counting of decay products of radio isotopes. Devices performing the function generally include a transducer which produces electrical pulses having magnitudes generally related to the energies of the decay products.

The window feature of the analyzer has particular value in discriminating between the particles emanating from a particular nucleus as opposed to those from other sources. The particles produced by a selected radio isotope undergoing decay will generally have energies falling within a narrow range. An appropriate selection by the comparators of the upper and lower limits of the analyzer's window permits the counting of these particles and the rejection of others with different energies.

Pulse height analyzers have had to overcome a problem associated with the use of the two comparators to establish the desired range. The pulses provided by the transducer almost invariably display sloping beginning and ending edges as opposed to square edges. Accordingly, a pulse exceeding the levels set by both comparators, and thus falling outside the energy range, effects transitions of the two comparators at different times. Consequently, analyzers of this type require circuitry to compare events occurring at different times. The circuitry must also, of course, accomodate the desired pulses which induce a transition in one of the comparators but none in the other.

Previous analyzers have extended the responses of the comparators to an input pulse sufficiently to insure coincidence of the extended responses at some particular time. The remaining circuitry of the analyzer then compares these extended responses. It determines whether the pulse exceeded the levels established by both comparators, thus falling outside of the established range, or merely exceeded the lower level to come within the selected window.

The analyzers have extended the comparators' responses by including resistance-capacitance (R-C) components within the circuitry. The monostable multivibrator represents one method of including the desired R-C components as shown in J. Laughter's article "TTL Gates Speed Up Pulse-Height Analyses" appearing in the Aug. 14, 1972, issue of Electronics on page 111.

Although performing satisfactorily in a number of applications, the circuits employing the R-C components, however, possess a number of inherent limitations. The proper comparison of the two comparators' outputs requires fairly precise timing on the extensions produced by the components. This in turn imposes strict limitations on the actual value of the resistances and compacitances used since these determine the relevant periods of extension. Furthermore, since these components tend to change over a period of time, they must undergo checks and possible replacement to assure that the originally selected values have not undergone alteration or degeneration.

Moreover, extending the outputs of the comparators increases the time that the circuitry remains occupied with a particular pulse. During this time, it can not react separately to a subsequent pulse. Thus, extending the comparators' outputs limits the ability of the pulse-height analyzer to resolve, or separately count, closely spaced pulses.

Additionally, the circuit makes its determination at a predetermined time after the lower-level comparator has signaled the arrival of a pulse. However, large pulses with a very slow rise time, may not have yet exceeded the upper level at this preset time. As a result, the circuit will indicate a pulse within the seleced energy range although, subsequently, the pulse exceeds the upper level. Thus, the circuit shows a limitation with very slow rising pulses as with very fast pulses.

Because of the above limitations, the search continues for pulse-height analyzers with less severe restrictions.

SUMMARY

Providing the appropriate indication for a pulse by the time it leaves the comparators will ameliorate and minimize the limitations inhereing in the R-C circuits. It will allow the elimination of the resistances and compacitances forming the R-C circuits and remove the required precise control over their values. Further, not extending the pulses beyond their natural duration, the circuit has the potential for improved resolution. Lastly, where the circuit actually waits until the end of the pulse, slow-rising inputs will not produce deceptive results.

This type of circuit, as with the prior circuits, includes two comparators. The firt comparator produces one voltage or current output when the input pulse falls below a first predetermined level and another output when the pulse exceeds that level. It produces the first of these outputs before an input pulse has crossed the predetermined level near its beginning. The second output results after the pulse has crossed the level and until the pulse crosses back over that level near its end.

The second comparator operates analagously with regards to a second predetermined level. With the first comparator producing the first and second outputs, the second comparator produces a third output before an input pulse has crossed the second predetermined level near its beginning. A fourth output appears from the time a pulse has crossed the second predetermined level at the beginning of the pulse until it has recrossed that level near its end.

A coincidence means, coupled to these comparators, converts their outputs to information useful for subsequent processing. The coincidence means operates whenever the output of the first comparator switches from its first to its second output. This indicates that the pulse has come within one limit of the preselected range.

After the switching of the first comparator's output, the coincidence means provides a first indication should the second comparator switch from the third to the fourth output prior to when the first comparator switches back to its first output. This serves to indicate that the pulse has gone beyond both limits of the selected range.

Contrariwise, the first comparator may switch from the first to the second output and return to the first without the second comparator having switched at all.

This ocurs when the pulse exceeds one limit of the range but not the other and consequently deserve counting. When this happens, the coincidence means provides a second indication.

To avoid extending the input pulses, the coincidence means should provide its information by about the time the first comparator has switched back from the second to the first output near the pulse's end. This eliminates the need for the R-C circuit components and the possible error they may introduce. The ability of the analyzer to resolve close pulses and operate upon slow-rising pulses may also show the desired improvement.

For a pulse height analyzer, specifically, the first predetermined level occurs lower than the second level. The pulse crosses one or both of these first from the lower side near the beginning of the pulse, and then from the higher side as the pulse approaches its termination.

Present comparators allow one of their outputs to equal a logical ZERO value and their other output to assume a logical ONE. This type of comparator permits the further processing of information by other logic components. In particular, a D-type flip-flop may serve as the coincidence means. The first comparator then couples to the clock input of the flip-flops to activate it upon the arrival of a pulse. With the second comparator coupled to the reset input, the information it produces when a pulse exceeds the upper level controls the flip-flop's output. Employing this arrangement allows the indications provided by the flip-flop to become available at about the time that the pulse, near its end, falls below the lower level.

When the input pulse exceeds the level set by both comparators, the coincidence-means flip-flop produces a logical ZERO at its Q output for its first indication. This ZERO appears at about the time the pulse falls below the lower level established by the first comparator.

When the pulse exceeds only the lower level the second comparator cannot reset the flip-flop. Accordingly, at the end of the pulse, the Q output will provide, as the coincidence means' second output, a logical ONE.

Output means convert the indications from the coincidence means into a different electronic results. Generally, this will assume the form of a normal level, most conveniently logical ZERO, in the absence of any pulse at the comparators. Where a pulse exceeds only the lower level and thus comes within the desired range, the output means may provide a single pulsed variation from the normal level. For a pulse that exceeds both levels and falls outside the range, the output means will not vary from its normal level.

BRIEF DISCRIPTION OF THE FIGURES

FIG. 1A shows a pulse height analyzer which utilizes an external clock. FIG. 1B illustrates the timing of the voltages at a number of the components in FIG. 1A.

FIG. 2A includes a circuit which relies upon internally produced timing derived from the input pulses themselves. FIG. 2B illustrates the voltages at different locations for FIG. 2A.

FIG. 3A's circuit, while similar to FIG. 2A, provides its final output by about the time the pulse has departed from the comparators. FIG. 3B shows the timing for various components in FIG. 3A.

DETAILED DESCRIPTION

Figure 1A:
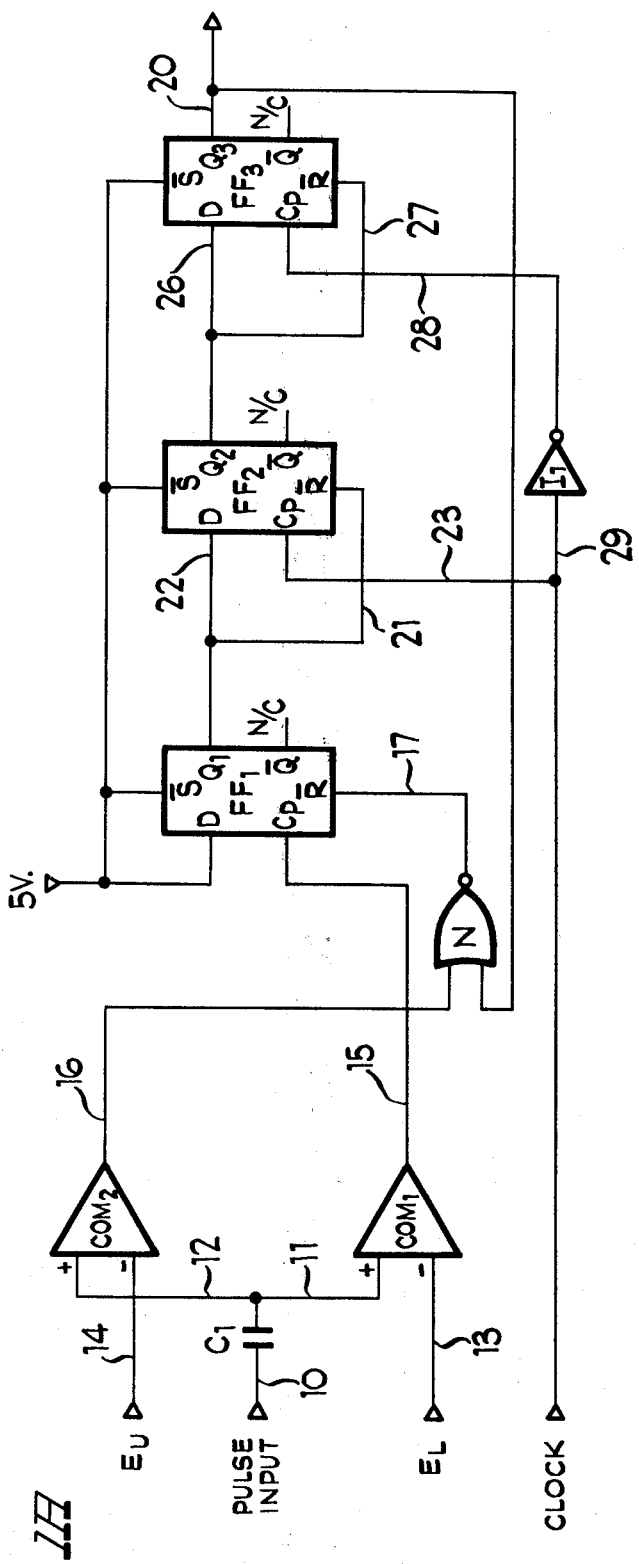

In FIG. 1, a pulse, perhaps produced by a transducer, appears along the lead 10 where it encounters the capacitor $C_1$. The capacitor $C_1$ serves merely to provide an a.c. coupling from the input to the rest of the circuit while blocking out any d.c. voltage. After the capacitor $C_1$, the pulse then proceeds along the lead 11 to the lower level comparator $COM_1$ and the lead 12 to the upper-level comparator $COM_2$.

The lower voltage level $E_L$ appears along the lead 13 and provides the other input to the first comparator $COM_1$. The level $E_L$ of course establishes the lower limit for the preselected range or "window." Generally, the apparatus will include components coupling to the lead 13 to allow for the selection of the particularly desired lower limit $E_L$. Similarly, the desired upper limit $E_U$ of the range appears along the lead 14 which connects to the second comparator $COM_2$.

The comparator COM produces two outputs. Its higher voltage output represents a logical ONE, with the lower voltage output representing a logical ZERO. As diagramed in FIG. 1B, when the pulse input along lead 11 remains below the lower level $E_L$, the output assumes the logical ZERO along the lead 15. When the pulse exceeds the lower level $E_L$, the lower level comparator $COM_1$ produces a logical ONE. Similarly, the upper level comparator $COM_2$ produces a ZERO on the lead 16 when the pulse on the lead 12 remains below the upper level $E_U$ of the range and a ONE when the pulse exceeds the upper level $E_U$.

The output from the first comparator feeds along the lead 15 to the clock input $C_P$ of the D-type flip-flop $FF_1$. Upon receiving a positive-going pulse at its clock input, the D-type flip-flop transfers the input appearing at its D terminal to its Q output. Moreover, the D input to the flip-flop $FF_1$ remains permanently affixed to the logical ONE value of plus five volts d.c. Accordingly, upon the receipt of a positive-going pulse from the lead 15, the flip-flop $FF_1$ will produce a ONE at the $Q_1$ output.

Figure 1B:
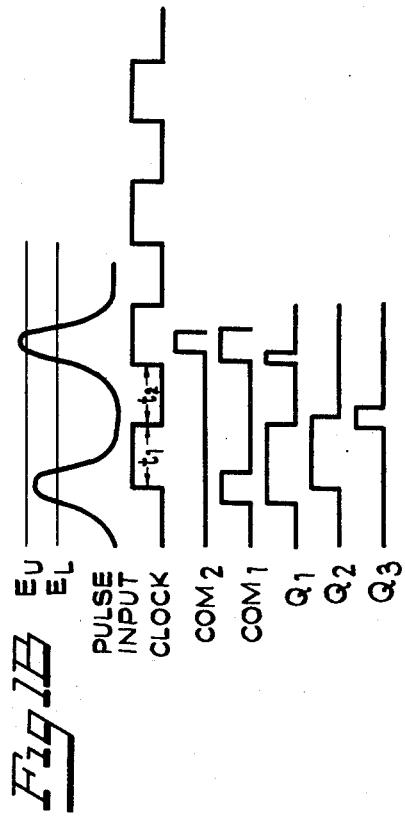

However, the first comparator $COM_1$, as shown in FIG. 1B, can provide a positive-going pulse to the $C_P$ input at the moment that the pulse input first exceeds the lower level $E_L$. Crossing the level $E_L$ from below to above thus results in the flip-flop $FF_1$ providing a ONE at its output $Q_1$.

Should the input pulse rise sufficiently to cross the upper level $E_U$ of the desired range, the output from the second comparator $COM_2$ will switch from ZERO to ONE along the lead 16 to the NOR gate N. With either of its inputs in the ONE state, a NOR gate will produce a ZERO output. Thus, receiving a ONE from the comparator $COM_2$, the NOR gate N will provide a ZERO to the reset input 2/R of the flip-flop $FF_1$. The bar over the R in this notation indicates that a ZERO to this input will force the flip-flop $FF_1$ to provide a ZERO at its $Q_1$ output. The reset input $\overline{R}$ acts immediately and predominates over the input supplied to the flip-flop through the D and $C_P$ connections acting together. Consequently, when the input pulse exceeds both the lower level $E_L$ and the upper level $E_U$, the flip-flop $FF_1$ produces a ONE at its $Q_1$ output which, however, changes to a ZERO. This change to a ZERO occurs almost as soon as the pulse exceeds the upper level $E_L$, and thus, appears while the pulse remains at the input to the circuit along the lead 10.

On the other hand, a pulse which, having exceeded the lower level $E_L$, crests before reaching the upper level $E_U$, cannot return the $Q_1$ output of the flip-flop $FF_1$ to a ZERO. Moreover, the D input to the flip-flop $FF_1$, tied to the ONE state, also cannot induce a change of the output $Q_1$ to ZERO. Thus, for a pulse falling within the window determined by $E_L$ and $E_U$, the $Q_1$ output will return to ZERO only after the $Q_3$ output of the flip-flop $FF_3$ has produced a ONE pulse on the lead 20. This ONE pulse on the lead 20 causes the NOR gate N to produce a ZERO along the lead 17 which, when it reaches the reset input $\overline{R}$ of the flip-flop $FF_1$, returns the $Q_1$ output to ZERO.

Thus, any pulse input which exceeds the lower level $E_L$ causes the $Q_1$ output of the flip-flop $FF_1$ to jump to ONE. The $Q_1$ output will return to ZERO if the pulse also crosses the upper limit $E_U$. Otherwise, $Q_1$ will occupy the ONE state at least long enough to produce a ONE pulse on the output lead 20, which may even occur after the input pulse had departed from the comparators $COM_1$ and $COM_2$ by dropping below the lower level $E_L$.

The output are $Q_1$ appears at the reset $\overline{R}$ input to the flip-flop $FF_2$ along the lead 21 and also to the D input of the same flip-flop along the lead 22. A ONE value has no effect upon the $\overline{R}$ input. Consequently, a ONE from $Q_1$ must wait at the D input to the flip-flop $FF_2$ until a positive-going clock pulse appears along the lead 23. When such a pulse appears, it will induce the flip-flop $FF_2$ to transfer the ONE from its D input to its $Q_2$ output.

A ZERO from $Q_1$ travels along the lead 21 to the $\overline{R}$ input to the flip-flop $FF_2$ and immediately causes the output $Q_2$ to assume the ZERO state. A ZERO from $Q_1$ also appears at the D input to the flip-flop $FF_2$ where, upon the arrival of the next clock pulse, it would transfer to the $Q_2$ output. However, the $\overline{R}$ input to the flip-flop $FF_2$ accomplishes the same result for a ZERO from $Q_1$ without waiting for the next clock pulse.

As with $Q_1$, a ZERO output from $Q_2$ will pass to both the D input of the next flip-flop $FF_3$ along the lead 26 and to the $\overline{R}$ input of the same flip-flop along the lead 27. Again, a zero at the $\overline{R}$ input immediately forces the $Q_3$ output to the ZERO state.

A ONE output from $Q_2$, having no effect on the $\overline{R}$ input to the flip-flop $FF_3$, must wait at the D input to that flip-flop for a positive-going or ONE pulse at its $C_P$ input. Such a pulse can appear only when a negative-going or ZERO pulse appears along the lead 29 for the inverter $I_1$ to transform into a ONE pulse. When this happens, the flip-flop $FF_3$ provides a ONE along the lead 20 at its $Q_3$ output.

However this ONE state does not last a particularly long time. The ONE on lead 20, as mentioned above, passes through the NOR gate N, and converts to a ZERO for the lead 17 and the $\overline{R}$ input to the flip-flop $FF_1$. This forces the $Q_1$ output to ZERO which travels along lead 21 to the $\overline{R}$ input to the flip-flop $FF_2$. Again, the $Q_2$ output goes ZERO which, when it appears at the $\overline{R}$ input of the flip-flop $FF_3$, returns the $Q_3$ output and the lead 20 to ZERO.

Consequently, as illustrated in FIG. 1B, a pulse exceeding the lower level $E_L$ but not the upper level $E_U$ causes $Q_1$ to go to ONE. Upon the receipt of the first positive, or ONE, clock pulse, $t_1$ in FIG. 1B, the flip-flop $FF_2$ will produce a ONE at its $Q_2$ output. At the succeeding negative clock pulse, the beginning of $t_2$, the flip-flop $FF_3$ produces a ONE at its $Q_3$ output along the output lead 20. This ONE feeds back through the flip-flops to return the lead 20 to the ZERO state and produces a short positive pulse. Such positive pulses on the lead 20, when counted, determine the number of input pulses falling within the desired range.

An input pulse exceeding both the $E_L$ and the $E_U$ levels in the circuit of FIG. 1A results in certain ambiguities, depending upon the duration of the pulse. During the interval after the pulse crosses the lower level $E_L$ but before it exceeds the upper level $E_U$, the circuit, of course, considers it as a pulse within the desired range. Finally, when it crosses the $E_U$ level, it informs the circuit of the contrary.

However, if the pulse remains between the two levels sufficiently long, the circuit may, in fact, produce an output pulse indicating that the input pulse fell within the desired range. Specifically, if the input pulse exceeds $E_L$ immediately prior to a positive clock pulse $t_1$ and remains below $E_U$ throughout the entire $t_1$, then the circuit counts it as a pulse within the range. This derives from the fact that the $Q_1$ output jumps to ONE almost as soon as the first comparator $COM_1$ produces a ONE output when the pulse crosses the $E_L$ level. This ONE from $Q_1$ then transfers to the $Q_2$ output of th flip-flop $FF_2$ upon the receipt of the positive-going clock pulse at the beginning of $t_1$. On the negative clock pulse ending $t_1$, the ONE from $Q_2$ transfers to $Q_3$ on the flip-flop $FF_3$ which indicates an input pulse within the range.

Accordingly, any pulse which exceeds the upper level E within the same time period $t_1$ as when it exceeded the lower level $E_L$ cannot produce a positive pulse on the lead 20. A slow-rising pulse which takes longer than $t_1$ to cross the upper level $E_U$ after exceeding the $E_L$ may produce an output pulse, depending upon when it exceeded the lower level $E_L$. It definitely will produce a pulse should the time period of $2t_1 + t_2$ intervene between the crossing of the $E_L$ and $E_U$ levels.

Generally, however, the time for an input pulse to exceed the upper level $E_U$ after crossing the lower level $E_L$ represents a small period compared to the time $t_1$. Consequently, the possible production of a spurious output pulse for an input pulse exceeding the upper level $E_U$, as a practical matter, presents no serious problem. Moreover, the time for the pulse to exceed the upper level $E_U$ may result from the presence of an additional pulse within the desired range very close to and merely forming a "shoulder" on the larger pulse. In this instance, the ability to produce an output indicative of the closely spaced smaller pulse may represent a desirable feature.

The receipt of a ZERO at the set inputs $\overline{S}$ of the flip-flops in FIG. 1 produce a ONE at the Q outputs. This setting of the flip-flops does not require the concurrence of a pulse at the clock input $C_P$. Accordingly, by tying the $\overline{S}$ inputs to the logical-ONE five volt source, the $\overline{S}$ inputs become inoperative and do not affect the operation of the flip-flops.

The circuit of FIG. 1A requires an external clocking circuit. Moreover, the possibility of counting slow-rising pulses which nonetheless exceed the upper limit may represent an unacceptable feature in some situations. The circuits of FIGS. 2A and 3A both obviate these concerns.

Figure 2A:
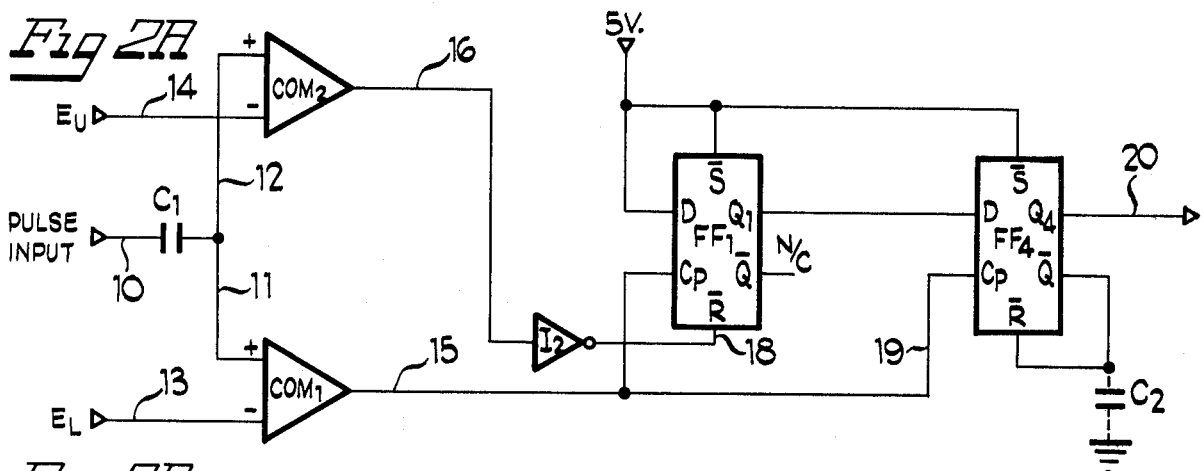

In the circuit of FIG. 2A, the two comparators $COM_1$ and $COM_2$, the capacitor $C_1$, and the flip-flop $FF_1$ operate in the same fashion as in FIG. 1. Consequently, they carry the same designations as do these components in the prior figure.

The capacitor $C_1$ again serves to provide a a.c. coupling between the pulse input and the comparators while excluding d.c. voltages. However, they also exclude very slow-rising pulses themselves. The circuit of FIG. 2, which responds well to such pulses, may omit the capacitor $C_1$ for those applications which expect them.

The output of the comparator $COM_2$ feeds through the invertor $I_2$, along the lead 18, and to the $\overline{R}$ input of the flip-flop $FF_1$. As with FIG. 1, this arrangement provides a ZERO to this $\overline{R}$ input whenever the input pulse exceeds the upper level $E_U$. The ZERO resets the flip-flop so that its $Q_1$ output drops to ZERO to preclude counting the large pulse as falling within the desired range.

FIG. 1A also includes the NOR gate N. Upon the appearance of a positive output pulse on the lead 20, the gate N resets the first flip-flop $FF_1$ to force its $Q_1$ output to ZERO. If $Q_1$ remained ONE for a number of clock pulses, the circuit would produce several output pulses at its output on lead 20, one for each clock pulse. Consequently, the circuit in FIG. 1A requires the feedback from the lead 20 through the NOR gate N to reset itself after having provided a positive output pulse.

In FIG. 2A, as discussed below, the input pulses along lead 10 also activate the flip-flops through their clock inputs. Consequently, by controlling the flip-flops, the input pulses provide the circuit with the information requisite to prevent unwarranted output pulses. Thus, the need for the circuit output to reset the flip-flop $FF_1$ becomes obviated. As a result, FIG. 2A does not include the NOR gate N or any coupling between the lead 20 and the reset input $\overline{R}$ of the flip-flop $FF_1$.

Figure 2B:
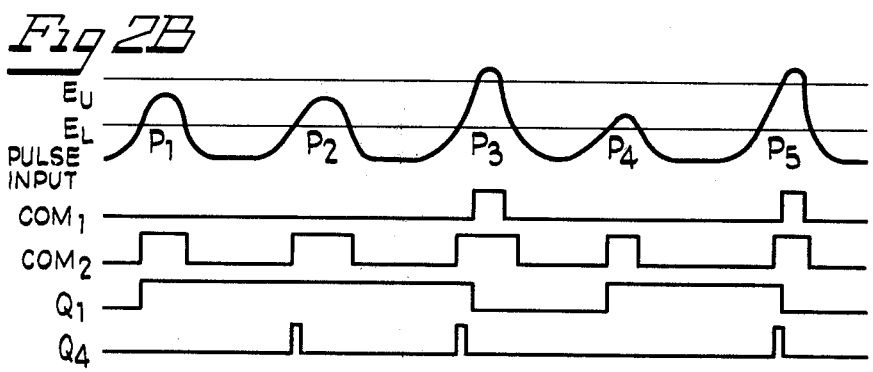

Consequently, the $Q_1$ output in FIG. 2B assumes the ONE state as soon as an input pulse, crossing the lower level $E_L$, provides a ONE to the clock input $C_P$ of the first flip-flop $FF_1$. $Q_1$ will remain in the ONE state until some input pulse exceeds the upper level $E_U$ and provides a ONE along the lead 16 to the invertor $I_2$, which converts it to a ZERO for the $\overline{R}$ input of the flip-flop $FF_1$. At that time, the $Q_1$ output returns to ZERO.

As the timing diagram in FIG. 2B shows, the $Q_1$ output in the first instance jumps to ONE upon the receipt of a pulse $P_1$ crossing the lower level $E_L$. It remains positive until the third pulse $P_3$ finally crosses the upper level $E_U$, causing it to return to ZERO. $Q_1$ then stays ZERO until the fourth pulse $P_4$ again crosses the lower level $E_L$ and remains at ONE until the fifth pulse $P_5$ crosses the upper level $E_U$.

When a pulse falling within the desired range induces the $Q_1$ output to assume the ONE state, it becomes available to the D input of the flip-flop $FF_4$. To transfer from the D input of the flip-flop $FF_4$ to the $Q_4$ output requires, of course, an activating positive-going ONE pulse along the lead 19 to its $C_P$ input. However, the same activating pulse that caused the transfer in the flip-flop $FF_1$ cannot effectuate a similar transfer of the same ONE in the next flip-flop $FF_4$. This results from the time actually required for the transfer from the D input to the $Q_1$ output of the first flip-flop. As a result, the ONE has not yet appeared at $Q_1$ when the same pulse activates the $C_P$ input of the flip-flop $FF_4$. Consequently, after an input pulse has placed $Q_1$ in the ONE state, it remains there for the succeeding pulse along the lead 19 to transfer it to the $Q_4$ output.

As shown for the sequence of pulses in FIG. 2B, the first pulse input $P_1$ crosses the lower $E_L$ but not the upper level $E_U$. When it exceeds the lower level, it causes the first comparator $COM_1$, previously ZERO, to rise to ONE. This positive-going pulse from $COM_1$ appears at the first flip-flop $FF_1$ and causes its $Q_1$ output to go from ZERO to ONE. The same pulse from the comparator $COM_1$ also appears at the clock input $C_P$ of the flip-flop $FF_4$. However, at that time, the D input to that flip-flop lies at ZERO. Accordingly, notwithstanding the receipt of the pulse $P_1$, the $Q_4$ output remains ZERO.

Subsequently, the first pulse input descends below the level $E_L$ and causes the first comparator $COM_1$ to return to ZERO. As shown in the diagram, though, the $Q_1$ output remains at ONE.

The second pulse input $P_2$ similarly exceeds $E_L$ but not $E_U$. As it crosses the lower level $E_L$, the first comparator $COM_1$ again transitions from ZERO to ONE. This positive-going pulse appears along the lead 19 to the clock input $C_P$ of the flip-flop $FF_4$. It accordingly transfers the ONE which appeared at the D input of that flip-flop shortly after the prior pulse $P_1$ had exceeded the $E_L$ level, to the $Q_4$ output. As a result, this ONE appears on the output lead 20.

Simultaneously, with the appearance of the ONE at the $Q_4$ output, its converse, or ZERO appears at the $\overline{Q}$ output of the flip-flop $FF_4$ which connects to the reset input $\overline{R}$. the ZERO at $\overline{R}$ causes the $Q_4$ output of the flip-flop $FF_4$ to return to ZERO to produce a ONE pulse or, equivalently, a single pulsed variation along the lead 20.

Including the capacitor $C_2$ if desired, causes a slight delay until the $\overline{R}$ input receives the ZERO input and the lead 20 returns to ZERO afterwards. This allows for the production of a pulse on the lead 20 of any desired length. Omitting the capacitor $C_2$ results in a shorter pulsed output on the lead 20.

Thus, the second pulse input $P_2$ on the lead 10 has educed a single pulsed output on the lead 20. This output pulse, however, signifies that the first input pulse $P_1$ fell within the desired energy range. It says nothing about the magnitude of the second pulse $P_2$ which has merely served a midwife role in bringing forth this output pulse from the flip-flop $FF_4$.

The second pulse $P_2$, as it exceeds the lower level $E_L$, induces the comparator $COM_1$ to return to the ONE state. Again, the ONE at the D input of the flip-flop $FF_1$ transfers to the $Q_1$ output. However, since $Q_1$ had become positive on the first pulse, it simply remains in that state when the second pulse reaches the $C_P$ input of that flip-flop.

The third pulse input $P_3$ first exceeds the lower level $E_L$ and then the lower level $E_U$. Its first crossing of $E_L$ causes the first comparator $COM_1$, to jump to the ONE state. This positive pulse from the comparator $COM_1$ moves along the lead 19 to the clock input $C_P$ of the flip-flop $FF_4$. This again transfers the one appearing at the D input of that flip-flop to its output $Q_4$. After the appropriate time, the connection between the $\overline{Q}$ output of the flip-flop $FF_4$ and its $\overline{R}$ input returns the lead 20 to ZERO to formulate the desired output pulse.

Thus, the third pulse input $P_3$ which does not fall within the desired range has produced a pulsed output from $Q_4$ which signifies that the circuit had, in fact, received a pulse in the selected window. However this pulsed output derives from the second pulse input $P_2$ and not the third pulse $P_3$ which again has merely served to elicit this output pulse.

Since, for the pulse $P_3$, the comparator $COM_1$ for $E_L$ goes positive before the comparator $COM_2$, it again transfers the ONE at the D input of the flip-flop $FF_1$ to its $Q_1$ output. Previously at ONE due to the prior pulses, $Q_1$ merely remains in the ONE state, albeit for a short period of time. As soon as the third pulse $P_3$ exceeds the upper level $E_U$, the second comparator $COM_2$ goes to ONE. The invertor $I_2$ converts this ONE to a ZERO for the $\bar{R}$ input to the flip-flop $FF_1$. The ZERO to the reset input $\bar{R}$ causes $Q_1$ to drop to ZERO.

The fourth pulse input $P_4$ again falls within the preselected range. By similar reasoning as for the first pulse input $P_1$, the fourth pulse $P_4$ causes $Q_1$ to go from ZERO, into which the pulse $P_3$ had placed it, to ONE. However, $Q_1$ had existed in the ZERO state when the first comparator $COM_1$ went to ONE. Thus a ONE pulse to the clock input $C_P$ of the fourth flip-flop $FF_4$ causes a $Q_4$ output to remain at ZERO resulting in no pulse output. This simply indicates that the third pulse $P_3$ exceeded both levels and thus should not be counted as falling within the window.

Reversing the two leads 12 and 14 in FIG. 2A to the comparator $COM_2$ permits the elimination of the invertor $I_2$. Accordingly, the pulse input appears at the negative-labelled connection of the comparator $COM_2$ while the voltage establishing the upper level $E_U$ appears at its positive connection. This arrangement produces the same effect as the wiring shown in the figure.

An occasional application may require a circuit which, for an input pulse within the range, does not wait for the succeeding pulse before producing an output pulse. The circuit of FIG. A effectuates the elimination of this delay.

This figure bears strong resemblance to FIG. 2A and, from the input through the first flip-flop $FF_1$, is identical. The comments for the earlier circuit accordingly also pertain to this one. Consequently, a slow-rising input pulse would dictate the removal of the capacitor $C_1$.

Furthermore, reversing the input connections to the upper-level comparator $COM_2$ would again allow the elimination of the invertor $I_2$. However, this circuit does require the invertor $I_3$. Since manufacturers sell a multitude of invertors in a single unit, employing the invertor $I_2$ generally does not entail additional expense.

The circuit also uses an additional invertor to accomplish one of the tasks of FIG. 2A in a different fashion. In particular, the invertor $I_4$ converts a ONE output from $Q_4$ to a ZERO for the $\bar{R}$ input of the flip-flop $FF_4$. This causes the $Q_4$ output to return to ZERO to construct the desired output pulse. The short transition time for the invertor $I_4$ to change to ZERO after receiving a ONE input allows for a ONE pulse along the output lead 20 of the desired duration. Clearly, however, the arrangements in FIGS. 2A and 3A would work well in the other circuit.

Figure 3A:
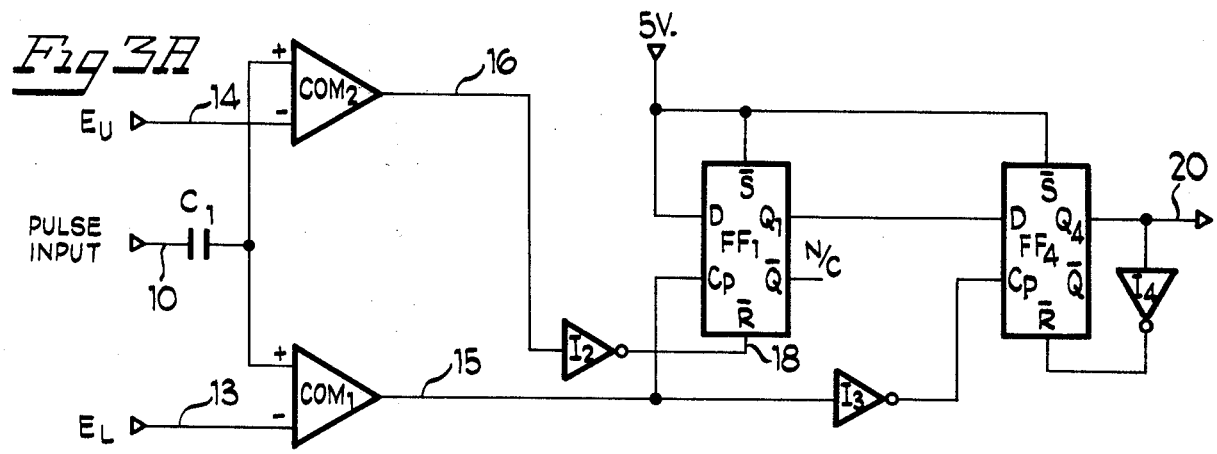

As with the prior figures, an input pulse to FIG. 3A first exceeds the lower level $E_L$. At that time, the first comparator $COM_1$ provides a ONE pulse along the lead 15 to the $C_P$ input of the flip-flop $FF_1$. This, of course, transfers a ONE from the D input of that flip-flop to its $Q_1$ output.

At some subsequent time, the input pulse will crest. It may do so, of course, either with or without having first crossed the upper level $E_U$. If it does cross that level, the second comparator $COM_2$ provides a ONE along lead 16 which the invertor $I_2$ converts to a ZERO along the lead 18 and to the $\bar{R}$ of the flip-flop $FF_1$. The ZERO to the $\bar{R}$ input causes the $Q_1$ output to promptly return to ZERO. If the input pulse crests without exceeding $E_U$, then $Q_1$ remains in the ONE state.

After reaching its zenith, the input pulse begins to descend. As it drops below the lower level $E_L$, the output of the first comparator $COM_1$ drops from ONE to ZERO which appears on the lead 15. The invertor $I_3$, of course, displays the opposite behavior, and goes from ZERO to ONE providing a positive-going ONE pulse to the $C_P$ input of the flip-flop $FF_4$. This ONE pulse effectuates the transfer of the information from the D input of the flip-flop $FF_4$ to its $Q_4$ output and the output lead 20. However, the information at that D input depends whether the very pulse which activated the $C_P$ input falls within the desired range. Thus, the pulse, on its rise, places a ONE or a ZERO on $Q_1$ as it comes within or exceeds the window, respectively; on its descent, the same pulse triggers the flip-flop $FF_4$ to provide a pulse or no pulse on the output lead 20, as appropriate.

Figure 3B:
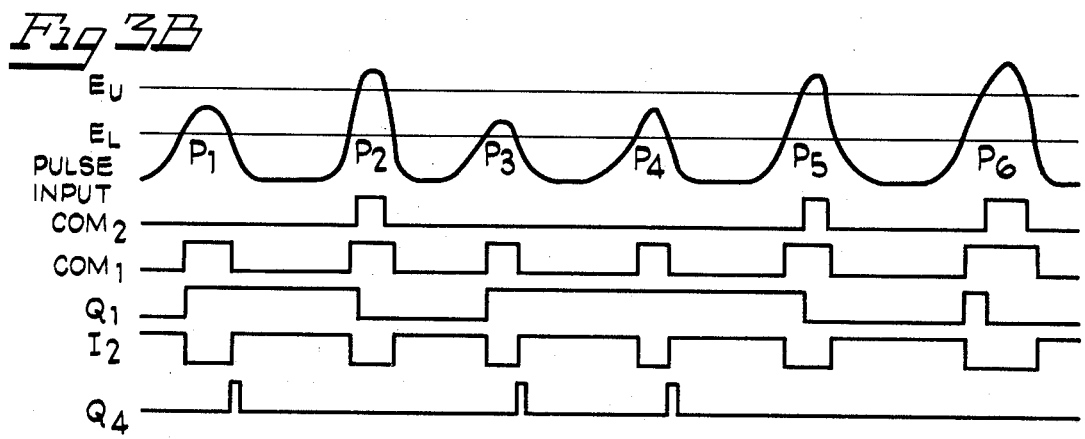

The timing diagram of FIG. 3B shows that the circuit provides the appropriate response for an input pulse at about the time that input pulse leaves the comparators $COM_1$ and $COM_2$. Pulses $P_1$, $P_3$, and $P_4$ fall within the desired range while the $P_2$, $P_5$, and $P_6$ exceed it. As shown for the $Q_4$ output, output pulses for each of $P_1$, $P_3$, and $P_4$ develop when those pulses finally descend below the lower level $E_L$.

The components suggested for the figures appear in the following table:

TABLE

| Components for the circuits in the figures | |
|---|---|
| Component | Identification |
| $C_1$ | 820 pf. |
| $C_2$ | 100 pf. |
| $COM_1$, $COM_2$ | μA710 |
| $FF_1$, $FF_2$, $FF_3$, $FF_4$ | SN7474N |
| $I_1$, $I_2$, $I_3$, $I_4$ | SN7404N |
| N | SN7402N |

The foregoing has discussed these components as though they possess instantaneous transitions times. Clearly, they do not; rather they require a finite time period before a change in their input produces the appropriate change in their output.

In FIG. 3A, after the lower-level comparator $COM_1$ has reached the ONE state, the flip-flop $FF_1$ requires 14 nanoseconds until its output $Q_1$ also goes to ONE. After the comparator $COM_1$ returns to ZERO as the input pulse drops below the lower level $E_L$, the invertor $I_3$ requires 12 nanoseconds to produce a ONE at the clock input $C_P$ of the flip-flop $FF_4$.

The flip-flop $FF_4$ requires at least 15 nanoseconds of a ONE input at its D connection before it can respond to a positive-going pulse at its clock input $C_P$. After these 15 nanoseconds, it requires an additional 14 nanoseconds to respond and produce a ONE at its $Q_4$ output. After the appearance of the ONE at the $Q_4$ output, and with a direct connection between the $Q_4$ output and the $\bar{R}$ input, the flip-flop $FF_4$ requires about 4 nanoseconds to reset its $Q_4$ output to ZERO.

Other types of components than those in the table experience different response times. For example, emitter-coupled logic (ECL) requires approximately one tenth of the time to respond. As drawbacks, they require a greater economic outlay for their puchase and larger amounts of power for their operation. Complementary metal-oxide semiconductors (CMOS), on the other hand, respond with one tenth of the speed.

The components in FIG. 3A require about 83 nanoseconds to formulate an output pulse after the lower level comparator $COM_1$ first produces a ONE on the lead 15. Subsequent to receiving a ONE at its clock input $C_P$, the flip-flop $FF_1$ requires 14 nanoseconds to produce a ONE at its $Q_1$ output. This must remain ONE for approximately 15 nanoseconds to set up the D input to the flip-flop $FF_4$. Upon its D input becoming set up, the flip-flop $FF_4$ then requires 14 seconds after the receipt of a positive-going ONE pulse at the $C_P$ input to transfer the ONE at its input to its $Q_4$ output. The circuit has required at least 43 nanoseconds at this point. As discussed above, 40 additional nanoseconds must pass to complete the pulse and reset the flip-flop $FF_4$.

However, the circuit can nonetheless resolve two pulses within the desired range occurring within 83 nanoseconds of each other. The flip-flop $FF_4$ requires 14 nanoseconds after the receipt of a positive pulse at its $C_p$ input until the information appears at its output $Q_4$. It then requires an additional 40 seconds until it can reset itself and for the $Q_4$ output to return to ZERO. It may then receive a subsequent pulse at its clock input $C_P$ to restart the process. Consequently, two pulses separated by 56 nanoseconds, and certainly if separated by 60 nanoseconds, will produce two separate output pulses on the output lead 20.

Further, for an input pulse within the window, the positive-going pulse from the invertor $I_3$ must not reach the clock input $C_P$ of the flip-flop $FF_4$ before it can transfer a ONE to its $Q_4$ output. From the time the first comparator $COM_1$ produces a ONE, this requires 14 nanoseconds for $Q_1$ to first go to ONE, and, subsequently, 15 nanoseconds, with $Q_1$ at one, before the D input to the flip-flop $FF_4$ sets up, totaling 29 nanoseconds. However, the invertor $I_3$ delays 12 nanoseconds in transfering from ZERO to ONE; thus the input pulse need maintain the comparator $COM_1$ at ONE for only 17 nanoseconds. An input pulse that allows the comparator $COM_1$ to return to ZERO before 17 nanoseconds will produce no output pulse.

Lastly, the circuit requires approximately 83 nanoseconds to construct an output pulse after the comparator $COM_1$ goes to ONE. Moreover, the comparator $COM_1$ must remain at ONE for at least 17 nanoseconds or else no output results. Accordingly the circuit requires no more than 67 nanoseconds, or 70 nanoseconds to allow leeway, after $COM_1$ returns to ZERO to produce the appropriate output pulse.

Accordingly, what is claimed is:
1. In a pulse analyzer of the type having:
    A. a first comparator producing first and second voltage or current outputs, one of said first and second outputs being produced when an input pulse is below a first predetermined level and the other of said first and second outputs being produced when said pulse is above said first predetermined level, said first comparator switching from said first to said second output when an input pulse crosses said first level near the beginning of said pulse and switching back from said second to said first output when said input pulse crosses said first level near the end of said pulse;
    B. a second comparator producing third and fourth voltage or current outputs, one of said third and fourth outputs being produced when said pulse is below a second predetermined level and the other of said third and fourth outputs being produced when said pulse is above said second predetermined level, said second comparator switching from said third to said fourth output when an input pulse crosses said second level near the beginning of said pulse and switching back from said fourth to said third output when said input pulse crosses said second level near the end of said pulse; and
    C. clocking means for providing repetitive pulses having a regular cycle,
the improvement comprising (1) coincidence means coupled to said first and second comparators for, when the output of said first comparator has switched from said first to said second output, providing:
    a. a first indication if the output of said second comparator has switched from said third to said fourth output prior to the time said first comparator has switched back from said second to said first output, and
    b. a second indication if the output of said second comparator has not switched from said third to said fourth output prior to the time said first comparator has switched back from said second to said first output,
said coincidence means providing said indications not later than about the time said first comparator has switched back from said second to said first output; and (2) output means coupled to said coincidence means and said clocking means for:
    i. producing, only upon the receipt of one of said pulses, a first result each time said coincidence means provides said second indication; and
    ii. producing a second result each time said coincidence means provides said first indication within a half of said cycle of the time said first comparator has switched from said first to said second output.

2. The improvement of claim 1 wherein one of said first and second outputs and one of said third and fourth outputs are voltage outputs and equal to each other and the other of said first and second outputs and the other of said third and fourth outputs are voltage outputs and equal to each other.

3. The improvement of claim 2 wherein said output means produces a normal voltage or current level in the absence of a pulse at said comparators; said first result is at least one pulsed variation from said normal level; and said second result is substantially no variation from said normal level.

4. The improvement of claim 3 wherein said first indication provided by said coincidence means is an electronic pulse ending by about the time said first comparator has switched back from said second to said first output and sid second indication is an electronic pulse lasting at least until the earlier of the time said first comparator has switched back from said second to said first output or said output means has produced said first result.

5. The improvement of claim 3 wherein said coincidence means includes a D-type flip-flop; said first comparator couples to the clock input of said flip-flop; and said second comparator couples to the reset input of said flip-flop.

6. The improvement of claim 5 wherein said flip-flop is a first flip-flop; said output means includes second and third D-type flip-flops; the output from said first flip-flop is coupled to the D and reset inputs of said second flip-flop; said clocking means couples to the clock input of said second flip-flop and, through an inverter, to the clock input of said third flip-flop; and the output of said second flip-flop couples to the D and reset inputs of said third flip-flop.

7. In a pulse analyzer of the type having:
  A. a first comparator producing first and second voltage or current outputs, one of said first and second outputs being produced when an input pulse is below a first predetermined level and the other of said first and second outputs being produced when said pulse is above said first predetermined level, said first comparator switching from said first to said second output when an input pulse crosses said first level near the beginning of said pulse and switching back from said second to said first output when said input pulse crosses said first level near the end of said pulse; and
  B. a second comparator producing third and fourth voltage or current outputs, one of said third and fourth outputs being produced when said pulse is below a second predetermined level and the other of said third and fourth outputs being produced when said pulse is above said second predetermined level, said second comparator switching from said third to said fourth output when an input pulse crosses said second level near the beginning of said pulse and switching back from said fourth to said third output when said input pulse crosses said second level near the end of said pulse,
the improvement comprising (1) coincidence means coupled to said first and second comparators for, when the output of said first comparator has switched from said first to said second output, providing:
  a. a first indication if the output of said second comparator has switched from said third to said fourth output prior to the time said first comparator has switched back from said second to said first output, and
  b. a second indication if the output of said second comparator has not switched from said third to said fourth output prior to the time said first comparator has switched back from said second to said first output,
said coincidence means providing said indications not later than about the time said first comparator has switched back from said second to said first output and continuing to provide the indication it provided immediately prior to the time said first comparator swtiched back from said second to said first voltage output until at least about the time said first comparator switches from said first to said second voltage output near the beginning of a succeeding pulse, and (2) output means coupled to said coincidence means for:
  i. producing a first result each time said coincidence means provides said second indication; and
  ii. producing a second result each time said coincidence means provides said first indication,
said output means, in producing said first result for a pulsed input, producing said first result between about the time said first comparator has switched from said first to said second voltage output near the beginning and the time said first comparator has switched back from said second to said first voltage output near the end of the next succeeding pulse at the beginning of which said first comparator switches from said first to said second voltage output.

8. The improvement of claim 7 wherein one of said first and second outputs and one of said third and fourth outputs are voltage outputs and equal to each other and the other of said first and second outputs and the other of said third and fourth outputs are voltage outputs and equal to each other.

9. The improvement of claim 8 wherein said output means produces a normal voltage or current level in the absence of a pulse at said comparators; said first result is a single pulsed variation from said normal level; and said second result is substantially no variation from said normal level.

10. The improvement of claim 9 wherein said second indication provided by said coincidence means is a first voltage or current magnitude lasting from at least about the time said first comparator switches from said first to said second voltage output until at least about the time said first comparator has switched back from said second to said first voltage output, and said second indication provided by said coincidence means is said first voltage or current magnitude lasting from at least about the time said first comparator switches from said first to said second voltage output but ending before about the time said first comparator switches back from said second to said first voltage output and a second voltage or current magnitude beginning before and lasting until at least about the time said first comparator has switched back from said second to said first voltage output.

11. The improvement of claim 10 wherein said coincidence means includes a D-type flip-flop; said first comparator couples to the clock input of said flip-flop; and said second comparator couples to the reset output of said flip-flop.

12. The improvement of claim 11 wherein said flip-flop is a first flip-flop; said output means includes a second D-type flip-flop; the output of said first flip-flop couples to the D input of said second flip-flop; and said first comparator couples to and provides a positive pulse to the clock input of said second flip-flop each time said first comparator provides a positive pulse to the clock input of said first flip-flop.

13. The improvement of claim 11 wherein said flip-flop is a first flip-flop; said output means includes a second D-type flip-flop; the output from said first flip-flop couples to the D input of said second flip-flop; and said first comparator couples through an invertor and provides a positive pulse to the clock input of said second flip-flop each time said first comparator provides a negative pulse to the clock input of said first flip-flop.

14. In a pulse analyzer of the type having:
  A. a first comparator producing first and second voltage or current outputs, one of said first and second outputs being produced when an input pulse is below a first predetermined level and the other of said first and second outputs being produced when said pulse is above said first predetermined level, said first comparator switching from said first to said second output when an input pulse crosses said first level near the beginning of said pulse and switching back from said second to said first output when said input pulse crosses said first level near the end of said pulse, and
  B. a second comparator producing third and fourth voltage or current outputs, one of said third and fourth outputs being produced when said pulse is below a second predetermined level and the other of said third and fourth outputs being produced when said pulse is above said second predetermined level, said second comparator switching from said third to said fourth output when an input pulse crosses said second level near the beginning of said pulse and switching back from said fourth to said third output when said input pulse crosses said second level near the end of said pulse the improvement comprising (1) coincidence means coupled to said first and second comparators for, when the output of said first comparator has switched from said first to said second output, providing:
- a. a first indication if the output of said second comparator has switched from said third to said fourth output prior to the time said first comparator has switched back from said second to said first output; and
- b. a second indication if the output of said second comparator has not switched from said third to said fourth output prior to the time said first comparator has switched back from said second to said first output, said coincidence means providing said indications not later than about the time said first comparator has switched back from said second to said first output, and (2) output means coupled to said coincidence means for:
  i. producing a first result each time said coincidence means provides said second indication; and
  ii. producing a second result each time said coincidence means provides said first indication, said output means producing a preselected result of said first and second results only upon the receipt of a leading edge of an electronic pulse of a predetermined polarity, said output means also including timing means for controlling the duration of said preselected result.

15. The improvement of claim 14 wherein one of said first and second oututs and one one said third and fourth outputs are voltage outputs and equal to each other and the other of said first and second outputs and the other of said third and fourth outputs are voltage outputs and equal to each other.

16. The improvement of claim 15 in an analyzer including clocking means for producing repetitive electronic clock pulses having a regular cycle wherein said clock pulses are said electronic pulses of a predetermined type.

17. The improvement of claim 15 wherein said output means produces a normal voltage or current level in the absence of a pulse at said comparators; said first result is a single pulsed variation from said normal level; and said second result is substantially no variation from said normal level.

18. The improvement of claim 17 wherein said second indication provided by said coincidence means is a first voltage or current magnitude lasting from at least about the time said first comparator switches from said first to said second voltage output until at least about the time said first comparator has switched back from said second to said first voltage output, and said second indication provided by said coincidence means is said first voltage or current magnitude lasting from at least about the time said first comparator switches from said first to said second voltage output but ending before about the time said first comparator switches back from said second to said first voltage output and a second voltage or current magnitude beginning before and lasting until at least about the time said first comparator has switched back from said second to said first voltage output.

19. The improvement of claim 18 wherein said coincidence means includes a D-type flip-flop; said first comparator couples to the clock input of said flip-flop; and said second comparator couples to the reset input of said flip-flop.

20. The improvement of claim 19 wherein said flip-flop is a first flip-flop; said output means includes a second D-type flip-flop; the output of said first flip-flop couples to the D input of said second flip-flop; and said first comparator couples to and provides a positive pulse to the clock input of said second flip-flop each time said first comparator provides a positive pulse to the clock input of said first flip-flop.

21. The improvement of claim 20 wherein said flip-flop is a first flip-flop; said output means includes a second D-type flip-flop; the output from said first flip-flop couples to the D input of said second flip-flop and said first comparator couples through an invertor and provides a positive pulse to the clock input of said second flip-flop each time said first comparator provides a negative pulse to the clock input of said first flip-flop.

22. The improvement of claim 18 wherein said coincidence means continues to provide the indication it provided immediately prior to the time said first comparator switches back from said second to said first voltage output until at least about the time said first comparator switches from said first to said second voltage output near the beginning of a succeeding pulse.

23. The improvement of claim 22 wherein said output means, in producing said first result for a pulsed input, produces said first result by about the time said first comparator has switched back from said second to said first voltage output near the end of the next succeeding pulse at the beginning of which said first comparator switches from said first to said second voltage output.

24. The improvement of claim 22 wherein said output means provides said first result for a particular pulse for which said output means provides said first result by about the time said first comparator switches back from said second to said first voltage output near the end of said particular pulse.

25. The improvement of claim 24 wherein said output means provides said first result within 70 nanoseconds after said first comparator has switched back from said second to said first voltage output near the end of said particular pulse.

26. The improvement of claim 24 wherein for two pulses for which said output means provides said first result, said output means provides two of said first results if said first comparator switches from said first to said second voltage output near the beginning of the second of said pulses at least about 60 nanoseconds after said first comparator has switched back from said second to said first voltage output near the end of the first of said pulses.

27. In a pulse height analyzer of the type having:
  A. a first comparator producing a first voltage output when an input pulse is below a first predetermined level and a second voltage output when said pulse is above said first predetermined level; and
  B. a second comparator producing a third voltage output when said pulse is below a second predetermined level and a fourth voltage output when said pulse is above said second predetermined level, said third voltage output substantially equaling one of said first and second voltage outputs and said fourth voltage output substantially equaling the other of said first and second voltage outputs, and said second predetermined level being no less than said first predetermined level, the improvement comprising (1) coincidence means coupled to said comparators for:
  i. producing (a) a fifth voltage output substantially equal to one of said first and second voltage outputs and lasting from about the time said first comparator switches from said first to said second voltage outputs and ending before or at about the time said first comparator switches back from said second to said first voltage output and (b) a sixth voltage output equal to the other of said first and second voltage outputs and lasting from about the time said fifth voltage output ends until at least about the time said first comparator switches back from said second to said first voltage output if said second comparator switches from said third to said fourth voltage output after said first comparator has switched from said first to said second voltage output and before said first comparator has switched back from said second to said first voltage output; and
  ii. producing said fifth voltage level lasting from about the time said first comparator switches from said first to said second voltage output until at least about the time said comparator switches back from said second to said first voltage output if said second comparator has not switched from said third to said fourth voltage output during that time, and (2) output means coupled to said coincidence means for producing:
  i. a normal substantially constant voltage output in the absence of any pulsed input to said comparators;
  ii. a single pulsed variation from said normal substantially constant voltage output for each time said coincidence means provides said fifth voltage output, said output means producing said single pulsed variation only upon the receipt of the leading edge of an electronic pulse of a predetermined polarity and including timing means for controlling the duration of said pulsed variation; and
  iii. substantially no variation from said normal substantially constant voltage output for each time said coincidence means provides said sixth voltage output.

28. The improvement of claim 27 wherein said output means couples to said first comparator; receives from said comparator a pulse of said predetermined polarity each time said first comparator switches back from said second to said first voltage output; and produces said single pulsed variation for each time said coincidence means provides said fifth voltage output at about the time said first comparator switches back from said second to said first voltage output.

29. The improvement of claim 28 wherein said coincidence means includes a D-type flip-flop; said first comparator couples to the clock input of said flip-flop; and said second comparator couples to the reset input of said flip-flop.

30. The improvement of claim 29 wherein said flip-flop is a first flip-flop and said output means includes a second D-type flip-flop; the output of said first flip-flop couples to the D input of said second flip-flop; and said first comparator couples to the clock input of said second flip-flop.

31. The improvement of claim 30 wherein the coupling between said first comparator and the clock inputs of said first and second flip-flops includes inverting means for providing a positive pulse to the clock input of said second flip-flop for each negative pulse provided to the clock input of said first flip-flop.

* * * * *